United States Patent [19]

Nishizawa et al.

[11] 4,171,995

[45] Oct. 23, 1979

[54] EPITAXIAL DEPOSITION PROCESS FOR PRODUCING AN ELECTROSTATIC INDUCTION TYPE THYRISTOR

[75] Inventors: Jun-ichi Nishizawa; Kentaro Nakamura, both of Sendai; Takashi Kitsuregawa, Nishinomiya, all of Japan

[73] Assignees: Semiconductor Research Foundation; Mitsubishi Denki Kabushiki Kaisha, both of Japan

[21] Appl. No.: 760,370

[22] Filed: Jan. 18, 1977

Related U.S. Application Data

[62] Division of Ser. No. 733,930, Oct. 19, 1976, Pat. No. 4,086,611.

[30] Foreign Application Priority Data

Oct. 20, 1975 [JP] Japan .............................. 50/126111
Oct. 20, 1975 [JP] Japan .............................. 50/126113

[51] Int. Cl.² ...................... H01L 21/20; H01L 21/22
[52] U.S. Cl. ...................................... 148/175; 29/571; 29/590; 148/187; 357/20; 357/21; 357/22; 357/38; 357/56; 357/58; 357/88
[58] Field of Search ................. 148/175, 187; 29/571, 29/590; 357/22, 38, 58, 88

[56] References Cited

U.S. PATENT DOCUMENTS

| | | | |
|---|---|---|---|
| 3,173,814 | 3/1965 | Law ..................... | 148/175 |
| 3,244,950 | 4/1966 | Ferguson ................. | 148/175 X |
| 3,252,003 | 5/1966 | Schmidt ................. | 357/38 X |
| 3,260,902 | 7/1966 | Porter ................. | 148/175 X |
| 3,274,400 | 9/1966 | Weinstein ................. | 357/38 X |
| 3,283,223 | 11/1966 | DeWitt et al. ................. | 357/38 X |
| 3,381,187 | 4/1968 | Zuleeg ................. | 357/38 X |
| 3,381,189 | 4/1968 | Hinkle et al. ................. | 357/22 |
| 3,404,295 | 10/1968 | Warner ................. | 148/175 X |
| 3,465,216 | 9/1969 | Teszner ................. | 357/38 |
| 3,468,017 | 9/1969 | Stacey et al. ................. | 29/590 X |
| 3,497,777 | 2/1970 | Teszner ................. | 357/38 |

OTHER PUBLICATIONS

"Epitaxial Deposition of Si and Ge" RCA Review, Dec. 1963, pp. 528-533.

*Primary Examiner*—L. Dewayne Rutledge
*Assistant Examiner*—W. G. Saba
*Attorney, Agent, or Firm*—Robert E. Burns; Emmanuel J. Lobato; Bruce L. Adams

[57] ABSTRACT

A process of manufacturing a static induction thyristor comprising providing a semiconductor substrate of the first conductivity type which defines a first semiconductor layer and forming a second semiconductor layer thereon of a second conductivity type. The first and second semiconductor layers have relative impurity concentrations effective for forming therebetween charge depletion regions when no electrical signal is applied to the second semiconductor layer and which prevent injection of charge carriers through the second semiconductor layer when the thyristor is in a blocking state, and such that electrically forward biasing the second semiconductor layer effectuates a sufficient reduction of the depletion regions that a sufficient quantity of charge carriers may be injected through the second semiconductor layer that the thyristor switches to a conductive state. The second semiconductor layer defines the gate region of the thyristor.

3 Claims, 35 Drawing Figures

FIG. 7H ern
EPITAXIAL DEPOSITION PROCESS FOR PRODUCING AN ELECTROSTATIC INDUCTION TYPE THYRISTOR This is a divisional of application Ser. No. 733,930, filed Oct. 19, 1976, now U.S. Pat. No. 4,086,611.

BACKGROUND OF THE INVENTION

This invention relates to an electrostatic induction type thyristor and also to a process of producing the same.

In thyristors having the conventional PNPN four layer structure only one base region forming the control electrode has been disposed therein and impossible to increase in impurity concentration resulting in an increase in base series resistance because the principal current flows through that base region. Further as the base region is coextensive with a cross section of a path for the principal current, it has increased in distributed capacity. Accordingly the resulting RC time constant has been increased and the operating frequencies have been limited to the highest value on the order of 10 kilohertzs at most.

More specifically, upon transferring conventional thyristors from their blocking state to their conducting state (which is called hereinafter a "turn-on"), the spread of the semiconductor region in its ON state can not be rapidly controlled and therefore a corresponding turn-on time can not be short. This is because the base region has a large RC time constant. Also upon transferring such thyristors from their conducting to their blocking state (which is called hereinafter a "turn-off"), long time has been taken until a very large number of majority and minority carriers having been injected into the junction in the ON state are moved through their diffusion to be absorbed by the particular electrode resulting in the extinction thereof. In addition, a turning-off voltage applied to the base region through a mating base electrode has been only effective for bringing that semiconductor region located adjacent to the base electrode into its OFF state without affecting any remote region spaced away from the base electrode. This is because the base region has a high series resistance. This has resulted in an increase in turn-off time. Alternatively the turn-off has been impossible. Therefore direct currents have been scarcely possible to be interrupted. Even if possible, low capacity thyristors have been only enabled to interrupt low direct currents. In other words, conventional thyristors have been disadvantageous in very many respects such that the operation can not be performed at ultrahigh speeds with high electric powers, the high speed operation is performed with a low efficiency, direct currents are scarcely possible to be interrupted and so on.

SUMMARY OF THE INVENTION

The present invention provides an electrostatic induction type a thyristor comprising a first semiconductor region formed of an intrinsic semiconductive material or a semiconductive material having a predetermined type conductivity and a low impurity concentration, a second semiconductor region of a predetermined type conductivity disposed adjacent to the first semiconductor region, and a third highly doped semiconductor region disposed within the first semiconductor region so that those portions of the first semiconductor region located on both sides of the third semiconductor region are continuous to each other through limited portions thereof, a first electrode disposed in ohmic contact with the first semiconductor region, a second electrode disposed in ohmic contact with the second semiconductor region and a third metallic electrode disposed in ohmic contact with the third semiconductor region.

Accordingly it is an object of the present invention to provide a new and improved electrostatic induction type thyristor device enabled to be operated at an ultrahigh speed with high electric powers and also with a high efficiency while being applicable to the interruption of direct currents.

It is another object of the present invention to provide a new and improved process of easily producing electrostatic induction type thyristors of the type as described in the preceding paragraph with good reproductivity.

BRIEF DESCRIPTION OF THE DRAWINGS

The present invention will become more readily apparent from the following detailed description taken in conjunction with the accompanying drawings in which.

Throughout the Figures like reference numerals designate the identical or corresponding components.

DESCRIPTION OF THE PREFERRED EMBODIMENTS

According to the principles of the present invention, a highly doped semiconductor region serving as a control electrode located between an anode and a cathode electrode is operative to decrease a potential barrier developed in a region formed of an intrinsic semiconductive material or semiconductive material with a low impurity concentration forming a path for the principal current thereby to reduce an electric field involved through the mixture of a multitude of holes and a multitude of electrons formed through the abrupt injection of carriers. This reduction in electric field permits the rapid transfer of the blocking state to the conducting state. Upon returning from the conducting state back to the blocking state, the potential barrier is again increased to a high value to suspend the injection of the carriers and in addition, the carriers internally accumulated are attracted and absorbed by the control electrode through the electric field. Thus the principal current scarcely passes through a high doped semiconductor region or a metallic electrode for controlling the carriers. (The highly doped semiconductor region and the metallic electrode are generically called herein "gate".) Accordingly the gate can increase in impurity concentration as required regardless of that semiconductor portion forming the principal current path. Also the gate is required only to occupy a small proportion of the intrinsic or low impurity-concentration semiconductor region. Further if the low impurity-concentration semiconductor region decreases in impurity-concentration then the gate can additionally decrease in distributed capacity and threrefore RC time constant. In addition, either one of an anode and a cathode electrode forming the main electrodes can be provided with a highly doped semiconductor region to inject a sufficiently large number of the carriers carrying the principal current with a high efficiency.

Figures 1A, 1B:
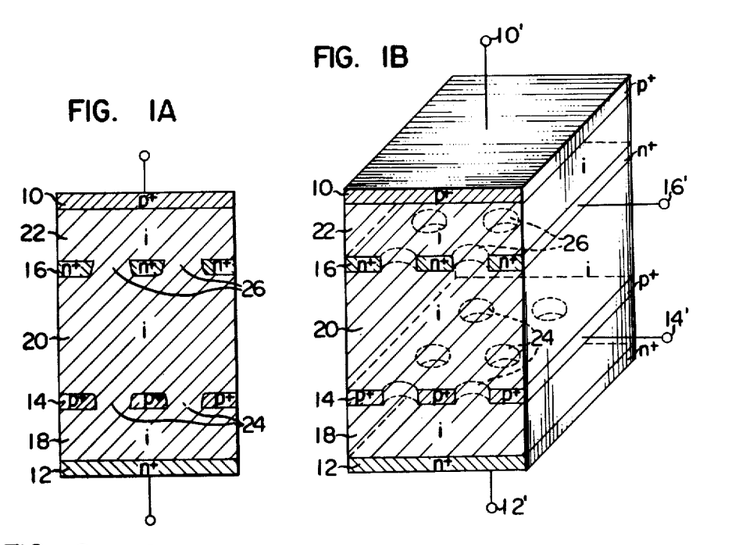
FIG. 1A is a schematic longitudinal sectional view of an electrostatic induction type thyristor useful in explaining the principles of the present invention.
FIG. 1B is a perspective view of the thyristor shown in FIG. 1A.

Referring now to FIGS. 1A and 1B of the drawings, there is illustrated an electrostatic induction type thyristor constructed in accordance with the principles of the present invention. The arrangement illustrated comprises an anode electrode 10 including a p+ type semiconductor region with a high impurity concentration and a cathode electrode 12 including an n+ type semiconductor region with a high impurity concentration, a first gate region 14 and a second gate region 16 disposed in spaced parallel relationship with each other and with the anode and cathode electrodes 10 and 12 respectively between both electrodes 10 and 12 and the remaining regions composed of an intrinsic semiconductive material to form a principal current path extending between both electrodes 10 and 12. More specifically, the first gate region 14 near to the cathode electrode 12 is of a p+ type semiconductive material with a high impurity concentration and sandwiched between the lowermost semiconductor region 18 as viewed in FIG. 1A and an intermediate semiconductor region 20 while the second gate region 16 near to the anode electrode 10 is of an n+ type semiconductive material with a high impurity concentration and sandwiched between the intermediate semiconductor region 20 and the uppermost semiconductor region 22 as viewed in FIG. 1A. The regions 18, 20 and 22 are formed of an intrinsic semiconductive material.

Each of the first and second gate regions 14 and 16 respectively is shown in FIG. 1A as including a plurality of circular apertures arranged in a predetermined pattern and filled with the same intrinsic semiconductive material as the regions 18, 20 and 22. The intrinsic semiconductive material confined by each aperture in the gate region 14 or 16 forms an intrinsic semiconductor region 24 or 26. Also the first and second gate regions 14 and 16 are shown in FIG. 1A as having the apertures aligned in pairs along the longitudinal axis of the arrangement although it is not necessarily required. Thus the semiconductor regions located on both sides of each gate region are continuous to each other through limited portions thereof and each gate region does not block the entire cross section of the principal current path as viewed in the direction thereof. Therefore intrinsic semiconductor regions 18, 20, 22 and 24 forming the principal current path are practically interconnected between the anode and cathode electrodes 10 and 12 respectively.

The anode and cathode electrodes 10 and 12 respectively are connected to respective metallic electrodes 10' and 12' while the first and second gate regions 14 and 16 have the lateral exposed surfaces connected to metallic gate electrodes 14' and 16'.

The operation of the arrangement as shown in FIGS. 1A and 1B will now be described. In operation the anode electrode 10 injects holes into the adjacent semiconductor region 22 and the cathode electrode 12 injects electrons into the adjacent semiconductor region 18 to form carriers within the semiconductive material. With no voltage applied across the anode and cathode electrodes 10 and 12 respectively or with a reverse voltage applied across those electrodes, a depletion layer formed adjacent to the gate region 14 or 16 due to a diffusion potential or the reverse voltage spreads around the gate region 14 or 16 to block a principal current path. That is, the so-called pinch-off state is developed and potential barriers are present before the carriers in the intrinsic semiconductor regions 18 and 22 adjacent to the cathode and anode electrodes 12 and 10 respectively. This prevents the injection of the carriers into the intrinsic semiconductor region and therefore put the semiconductor element in its blocking state.

Under these circumstances, the reverse voltage applied across the gate regions 14 and 16 can be removed. Alternatively a forward voltage may be applied across both gate regions 14 and 16. Then the first gate region 14 is put at a positive potential and the second gate region 16 is put at a negative potential. This causes the lowering of potential barriers in the intrinsic semiconductor regions 18, 20, 22, 24 and 26 to permit the holes from the anode electrode 10 to be injected into the semiconductor region 22 while the electrons from the anode electrode 12 are injected into the semiconductor region 18.

The injected holes pass through both the intrinsic semiconductor region 20 lowered in potential barrier and the intrinsic semiconductor regions 26 jaxtaposed with the second gate region 16 which regions 26 form one part of the principal current path and are also lowered in potential barrier until they are injected into the intermediate intrinsic semiconductor region 20. The holes injected into the intrinsic semiconductor region 20 are partly injected into the intrinsic semiconductor regions 24 and 18 without staying at the region 20.

On the other hand, the injected electrons similarly pass through both the intrinsic semiconductor region 18 lowered in potential barrier and the intrinsic semiconductor region 24 juxtaposed with the first gate layer 14 (which regions form one part of the principal current path) also lowered in potential barrier until they are injected into the intermediate semiconductor injected into the intermediate region 20. The electrons injected into the semiconductor region 20 are partly injected into the intrinsic semiconductor region 26 and 22 without staying at the region 20.

As a result, the intrinsic regions 18, 20, 22, 24 and 26 have a very large number of holes and electrons injected thereinto from the anode and cathode 10 and 12 respectively and intermixed. This causes the particular electric field to be abruptly decreased resulting in the occurrence of a negative resistance. At that time the turn-on is effected. Where the gate regions are low in time constant, the forward voltage applied across the gate regions instantaneously exerts its effect upon the entire areas of both gate regions. Therefore the turn-on operation is instantaneously performed unlike conventional thyristors. This is because the injection of the carriers is accomplished by lowering the potential barrier formed in the principal current path.

The arrangement of FIG. 1 in its ON state is turned off by applying a reverse voltage across the gate regions 14 and 16. That is, the first gate region 14 is rendered negative with respect to the second gate region 16. At that time the depletion layers instantaneously spread around the respective gate regions 14 and 16 resulting in the occurrence of the pinch-off state. Also the holes and electrons intermixed with each other within the intermediate intrinsic semiconductor region 20 are sucked into the first and second gate regions 14 and 16 respectively resulting in the simultaneous extinction thereof and hence the turn-off.

It is noted that this turn-off is instantaneously attained for the following reasons: The depletion layer is instantaneously spread. Also the movement of the carriers is caused from the attraction by the electric field but not from the diffusion effected in conventional thyristors.

The turning-off operation as above described is performed with various embodiments of the present invention as will be described later and also can be performed only by putting the first gate region 14 at the same potential as the cathode electrode 12. Also since the injection of carriers is suspended due to the pinch-off by the gate, it can be effected even with a voltage continuing to be applied across the anode and cathode electrodes following the ON state. This means that the arrangement of FIG. 1 is enabled to interrupt direct currents.

While the present invention has been describe in conjunction with the i type of the intrinsic regions 18, 20, 22, 24 and 26 it is to be understood that the same is equally applicable to the $\pi$ and $\nu$ types of intrinsic semiconductor regions and also to any combinations of the i, $\nu$ and $\pi$ types thereof. For example, the arrangement of FIG. 1 may includes the i type region 20, the $\nu$ type region 18 and the $\pi$ type region 20. In the specification and in the appended claims the i and $\pi$ type intrinsic semiconductor regions are generically called intrinsic semiconductor regions.

While the present invention is shown in FIG. 1 as having each of the anode and cathode electrodes provided with the highly doped semiconductor region it is to be understood that both electrodes are not required to be operatively associated with the respective highly doped regions and that such a highly doped region may be operatively associated only with either one of the two electrodes without the sacrifice of the efficiency of carrier injection.

Further while each of the first and second gate regions 14 and 16 respectively is shown in FIG. 1 as including a plurality of circular apertures in a predetermined pattern it is to be understood that the apertures are not necessary to be of the circular cross section and that they may be of the cross section having any desired shape. The apertures may be replaced by meshes or slits. It has been found that the gate region is preferably of a net. It is essential that both gate regions do not block the entire cross section of the principal current path as viewed in the longitudinal axis thereof. In addition, it is to be noted that those configurations of both gate regions projected in the direction of the principal current path are not necessarily required to be identical to each other as shown in FIG. 1.

The provision of a single highly doped semiconductor region operatively associated only with one of the anode and cathode electrodes and the configuration of and positional relationship between both gate regions as above described are applicable to other embodiments of the present invention as will be described hereinafter and the description thereof is omitted in such embodiments.

Figure 2:
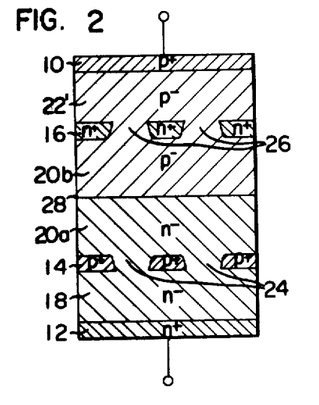
FIG. 2 is a schematic longitudinal sectional view of another thyristor constructed in accordance with the principles of the present invention.

FIG. 2 shows a modification of the present invention. The arrangement illustrated is different from that shown in FIG. 1 only in that in FIG. 2 an n$^-$ type semiconductor region 20a with a low impurity concentration is substituted for one half the intermediate intrinsic semiconductor region 20 shown in FIG. 1 as being of the i type and contiguous to the anode electrode 10 and a p$^-$ type semiconductor region 20b with a low impurity concentration is substituted for the other half the semiconductive material contiguous to the cathode electrode 12 with a pn junction 28 formed between divided intermediate regions 20a and 20b.

The arrangement of FIG. 2 is operated as follows: First the pn junction 28 injects holes as minority carriers toward the cathode electrode 12 while it injects electrons as minority carriers toward the anode electrode 10. Upon turning-on of the arrangement, this injection results in the injection of carriers as in the arrangement of FIG. 1. As a result, a multitude of holes are intermixed with a multitude of electrons in the regions 18, 20a, 20b, 22, 24 and 26 thereby to abruptly decrease an electric field involved leading to the occurrence of a negative resistance. Upon turning-off, the holes and electrons are moved to and absorbed by the first and second gate regions 14 and 16 respectively under the influence of the particular electric field leading to the rapid extinction thereof.

The arrangement of FIG. 2 is advantageous in that the pn junction 28 exhibits the rectifying function.

It will readily be understood that the semiconductor regions 18, 20a and 24 are not necessarily required to be of the same type conductivity and to have a common impurity concentration as do the semiconductor regions 22, 20b and 26 and also that all those regions may be of an intrinsic semiconductive material as above described in conjunction with FIG. 1.

Figure 3A:
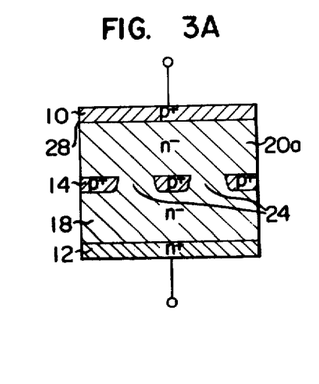
FIG. 3A is a schematic longitudinal sectional view illustrating the fundamental structure of the thyristor according to the present invention.

FIG. 3A shows an arrangement different from that illustrated in FIG. 2 only in that in FIG. 3A the second gate region 16 and the semiconductor regions 20b, 22 and 26 disposed adjacent thereto are omitted and the pn junction 28 is formed between the n$^-$ type regions 20a and the anode electrode 10. The arrangements as shown in FIG. 2 and 3A respectively are substantially identical in operation to each other. Briefly, upon turning on, electrons from the cathode electrode 12 are injected into the regions 18, 20a and 24 with the low impurity concentration while holes from the pn junction 28 are injected into those region as minority carriers. As in the arrangement of FIG. 2, the particular electric field is abruptly decreased to cause a negative resistance. Also upon turning off, those holes accumulated in the n$^-$ type regions 18, 20a and 24 are moved to the gate region 14 through the attraction by the electric field thereby to be absorbed by the gate region 14.

The operation as above described may be performed with a structure including a p type semiconductor region with a low impurity concentration sandwiched between the anode electrode 10 and the n$^-$ type region 20a with the pn junction 28 formed between those p$^-$ and n$^-$ type regions.

Figure 3B:
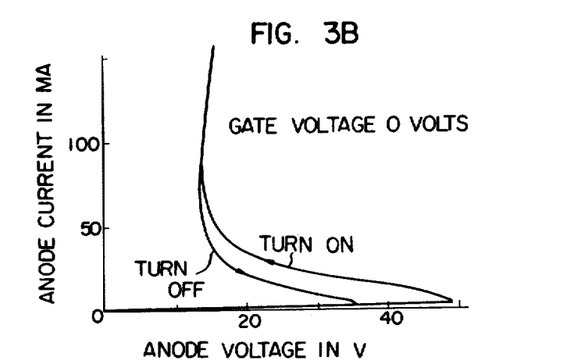
FIGS. 3B, 3C and 3D are graphs illustrating the operation characteristics of the thyristor shown in FIG. 3A.
Figure 3C:
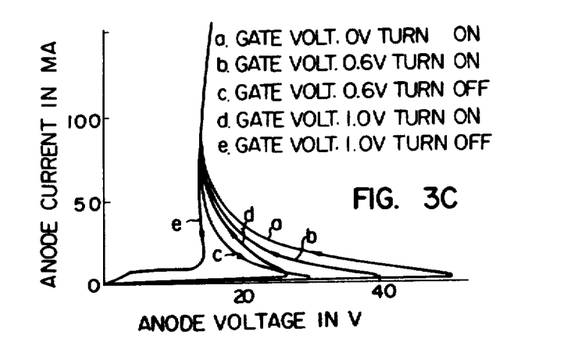
Figure 3D:
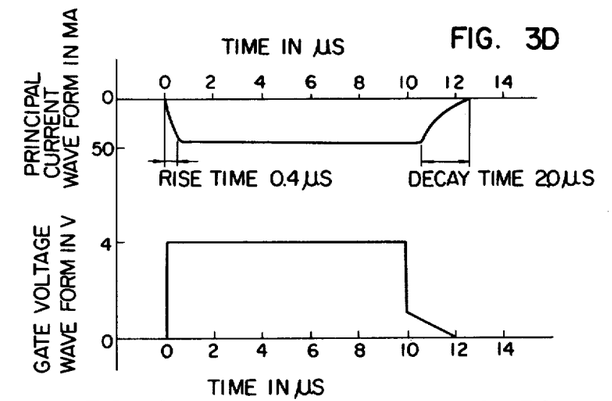

FIGS. 3B, 3C and 3D show various characteristics of the arrangement as shown in FIG. 3A providing an electrostatic induction type thyristor having a small operating area. FIG. 3B shows anode current in milliampere plotted in ordinate against an anode voltage in volts in abscissa with a gate voltage maintained at a null voltage. FIG. 3C similarly shows the anode voltage-to-current characteristics obtained when the gate voltage is varied from 0 to 1 volts with increments of 0.2 volts. In FIG. 3C curves labelled, a, b and d in describe characteristics obtained when the turn off is effected with a gate voltage of 0, 0.6 and 1.0 volt respectively and curves labelled c and e also described the characteristics with the turning off effected at a gate voltage of 0.6 and 1.0 volt respectively.

FIG. 3D shows waveforms of the principal current and a gate voltage on the upper and lower portions thereof respectively with the time axis graduated in microseconds. With a voltage of 25 volts applied to the anode electrode as shown in FIG. 3A, a pulse voltage of 4 volts having a pulse width of 10 microseconds as shown on the lower portion of FIG. 3D is applied to the gate region 14 also shown in FIG. 3A. Thereby a cathode current flowing through the arrangement of FIG. 3A reaches a maximum magnitude of 50 milliamperes with a rise time of 0.4 microsecond and responds to the end of the pulse voltage to decrease to a null magnitude with a decay time of 2.0 microseconds as shown on the upper portion of FIG. 3D. This proves that the direct current interruption is effected.

The present invention also concerns a process of producing an electrostatic induction type thyristor such as above described.

Figure 4A:
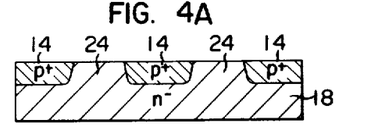
FIGS. 4A through 4D are fragmental longitudinal sectional view of still another thyristor constructed in accordance with the principles of the present invention and illustrated in the order of the manufacturing steps.

FIG. 4A through 4D show a process of producing the basic structure of electrostatic induction type thyristor in accordance with the principles of the present invention in the order of the manufacturing steps. An n⁻ type silicon substrate 18 with a low impurity concentration is first prepared. The substrate 18 is 100 microns thick and has, for example, a resistivity of 1,000 ohms-centimeter. Then an apertured semiconductor region highly doped with a p type impurity and compensated for strain is selectively diffused to a depth of 2 microns into one of the main opposite faces of the substrate 18 to form a first gate region 14 while leaving a plurality of those portions 24 of the substrate 18 forming one part of a principal current path in a predetermined pattern. The gate region 14 has an impurity concentration of from $10^{17}$ to $10^{21}$ atoms per cubic centimeter on the surface. The resulting structure is shown in FIG. 4A. The first gate region 4 has necessarily a high impurity concentration in order to provide a high speed response according to the present invention. By forming that region according to selective diffusion technique and sometimes by further compensating for lattice strains, the region can readily be decreased in crystal defects while the high impurity concentration is maintained. This is also applicable to the later manufacturing steps.

Figure 4B:
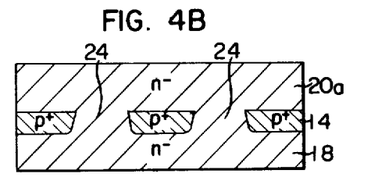

Subsequently an n⁻ type semiconductor layer 20a is epitaxially grown on the one main face of the substrate 18 or the surface of the gate region 14 including the substrate portions 24. The n⁻ type layer 20a has a low impurity concentration of from $10^{11}$ to $10^{16}$ atoms per cubic centimeter and a thickness of 30 microns. The structure thus processed is shown in FIG. 4B.

Figure 4C:
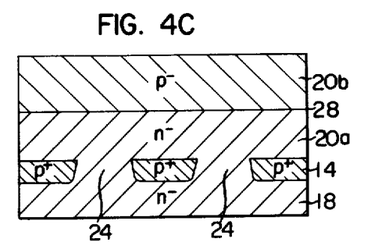

The epitaxial growth technique is again employed to form on the n⁻ type region 20a a p⁻ type grown layer 20b with a low impurity concentration of from $10^{11}$ to $10^{16}$ atoms per cubic centimeter to form a pn junction 28 therebetween as shown in FIG. 4C. The grown layer 20b is required to have a low impurity concentration in order to give the present device both a high response and a high efficiency. The use of the epitaxial growth technique can readily make a layer having any desired but uniform thickness and an impurity concentration as required. This is applicable to the later manufacturing steps. It will readily be understood that, if the layer 20b is of the p⁺ type, the arrangement of FIG. 3A is provided.

Figure 4D:
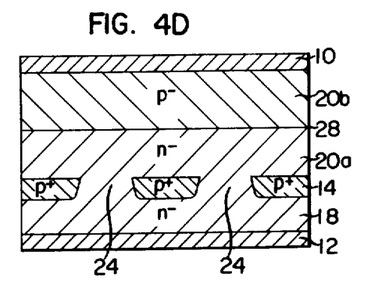

Following this, an anode and a cathode electrodes 10 and 12 respectively are disposed in ohmic contact with the surface of the p⁻ type layer 20b and the other main face of the substrate 1 in the well known manner resulting in the complete structure as shown in FIG. 4D.

If desired, the structure of FIG. 4D may be produced starting with the conductivity reversed from that illustrated. Also it is to be understood that each of the anode and cathode electrodes may include a metallic electrode attached thereto through a highly doped semiconductor region.

Figure 5A:
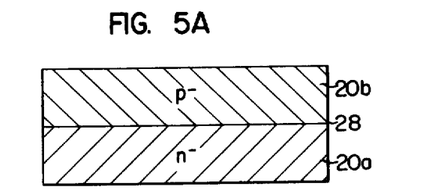
FIGS. 5A through 5F are views similar to FIG. 4 but illustrating the thyristor shown in FIG. 2.

FIGS. 5A through 5F show a modification of the process of producing an electrostatic induction type thyristor identical in structure to that shown in FIG. 2. In FIG. 5A a p⁻ type silicon substrate 20b with a low impurity concentration having a thickness of 100 microns and a resistivity of 1,000 ohms-centimeter is first prepared and then an n⁻ type semiconductor layer 20a with a low impurity concentration of from $10^{11}$ to $10^{16}$ atoms per cubic centimeter is epitaxially grown to a thickness of 30 microns on one of the main opposite faces of the substrate 20b to form pn junction 28 therebetween.

Figure 5B:
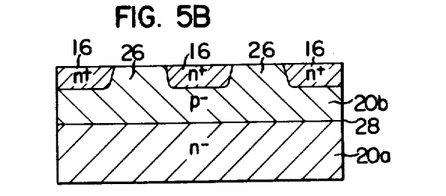

After the p⁻ type substrate 20b has been reduced to a thickness of 30 microns, an apertured, highly doped p type semiconductor region is selectively diffused into the surface of the p⁻ type substrate 20b to form a second gate region 16 and a plurality of substrate portions 26 forming one part of a principal current path as in FIG. 4A. This apertured semiconductor region is compensated for strains and has a high impurity concentration of from $10^{17}$ to $10^{21}$ atoms per cubic centimeter on the surface.

Figure 5C:
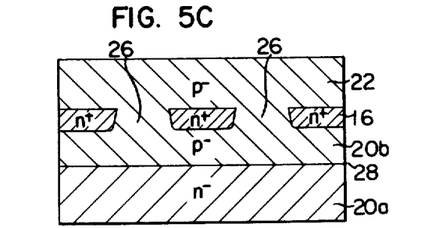

Thereafter a p⁻ type semiconductor region 22 with a low impurity concentration of from $10^{11}$ to $10^{14}$ atoms per cubic centimeter is epitaxially grown on the main face of the p⁻ type substrate 26b including the gate layer 16 as shown in FIG. 5C. This p⁻ type semiconductor layer 22 is identical in conductivity to the substrate 22b and preferably equal in impurity concentration to the latter.

Figure 5D:
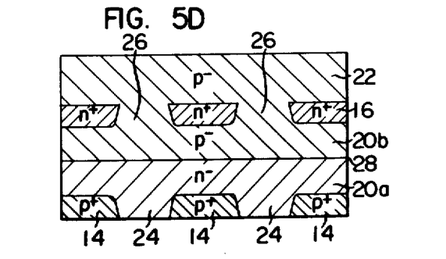

On the other hand, the step as above described in conjunction with FIG. 5B using a p type impurity is repeated on the exposed surface of the n⁻ type semiconductor layer 20a to form a first gate region 14 and a plurality of those portions 24 of the layer 20a forming one part of the principal current path as shown in FIG. 5D. The first gate layer 14 has a depth of 2 microns and a high impurity concentration of from $10^{17}$ to $10^{21}$ atoms per cubic centimeter on the surface.

Figure 5E:
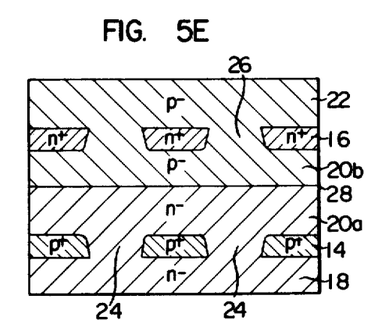

Then an n type semiconductor layer 18 with a low impurity concentration of from $10^{11}$ to $10^{16}$ atoms per cubic centimeter is epitaxially grown to a thickness of 15 microns on the exposed surface of the n⁻ type semiconductor layer 20a including the first gate region 14. The grown layer 18 is identical in conductivity to the n⁻ type layer 20a and preferably equal in impurity concentration to the latter. The resulting structure is shown in FIG. 5E.

Figure 5F:
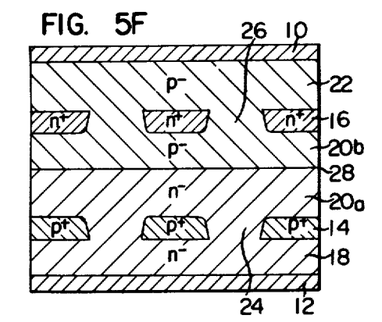

Subsequently, an anode and a cathode electrodes 10 and 12 respectively are disposed in ohmic contact with the $p^-$ and $n^-$ type regions 22 and 18 respectively in the manner well known in the art (see FIG. 5F). Then gate electrodes are attached to the first and second gate regions 14 and 16 as above described in conjunction with FIG. 1.

If desired, the process as shown in FIGS. 5A through 5F may proceeds starting with an $n^-$ type silicon substrate with a resistivity of 1,000 ohms-centimeter serving as the $n^-$ type layer 20a shown in FIG. 5A.

The process of the present invention as shown in FIG. 5 can decrease the number of the steps of forming on a grown layer another grown layer and therefore it has the advantage that electrostatic induction type thyristor are easy to be produced without the crystallographic properties deteriorated. By using the steps illustrated in FIG. 5A through 5F, layer thickness control can be effected with a high accuracy because the autodoping occurring upon the epitaxial growth affects an associated thicknessless. Also the advantage is exhibited in the thickness required for samples to have to prevent the same from breaking during their handling.

Figure 6A:
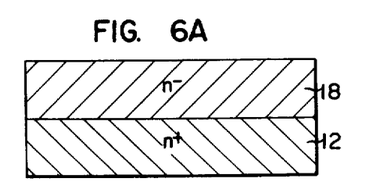
FIGS. 6A through 6J are views similar to FIG. 4 but illustrating still another modification of the present invention.

FIGS. 6A through 6I show an alternate process of producing an electrostatic induction type thyristor in accordance with the principles of the present invention. As shown in FIG. 6A, an n type highly doped silicon substrate 12 with a resistivity of 0.005 ohm-centimeter has epitaxially grown thereon an $n^-$ type semiconductor layer 18 having a low impurity concentration of from $10^{11}$ to $10^{16}$ atoms per cubic centimeter and a thickness of 15 micron. The semiconductor layer 18 is identical in conductivity to and less in impurity concentration than the substrate 12. The substrate 12 eventually forms a cathode electrode.

Figure 6B:
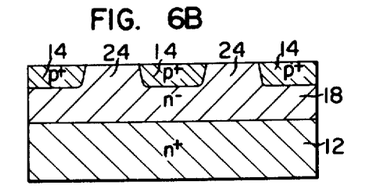

Then the selective diffusion step as above described in conjunction with FIG. 4A is repeated to form a first gate region 14 and a plurality of semiconductor portions 24 of a principal current path on the surface of the $n^-$ type semiconductor layer 18 as shown in FIG. 6B. As in the above examples, the apertured $p^+$ type semiconductor region or first gate region 14 has a high impurity concentration of from $10^{17}$ to $10^{21}$ atoms per cubic centimeter and a depth of 2 microns. The selective formation of the $p^+$ type region 14 may be accomplished by the selective growth, in addition to the selective diffusion. Alternatively, it may be attained by employing the selective etching or selective ion implantation following the diffusion or growth effected on the entire surface of the epitaxial layer 18.

Figure 6C:
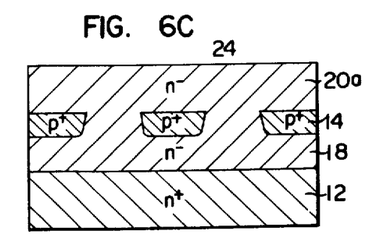

Subsequently an $n^-$ type semiconductor layer 20a with a low impurity concentration of from $10^{11}$ to $10^{16}$ atoms per cubic centimeter is epitaxially grown to a thickness of 30 microns of the entire surface of the $n^-$ type semiconductor layer 18 including the first region 14 as shown in FIG. 6C. This grown layer 20a is identical in both conductivity and impurity concentration to the grown layer 18.

Figure 6D:
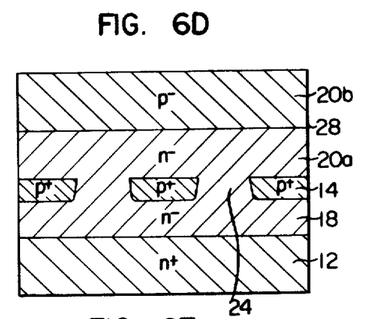

Following this a $p^-$ type semiconductor layer 20b with a low impurity concentration of from $10^{11}$ to $10^{16}$ atoms per cubic centimeter is epitaxially grown on the $n^-$ type epitaxial layer 20a to form a pn junction 28 therebetween with the $p^-$ type layer 20b 30 microns thick. The resulting structure is shown in FIG. 6D.

The selective diffusion step as above described in conjunction with FIG. 6B using an n type impurity is repeated to selectively form on the $p^-$ type grown layer 20b an apertured strain compensated $n^+$ type semiconductor region with a high impurity concentration of from $10^{17}$ to $10^{21}$ atoms per cubic centimeter. This layer has a thickness of 2 microns and forms a second gate region 16 and leaves a plurality of principal current path portions 26 (see FIG. 6E).

Subsequently, a $p^-$ type semiconductor layer 22 with a low impurity concentration of from $10^{11}$ to $10^{16}$ atoms per cubic centimeter is epitaxially grown on the entire surface of the $p^-$ type semiconductor layer 20b including the second gate region 16 to be 15 microns thick (see FIG. 6F) and then overlain with a strain compensated $p^+$ type diffused or epitaxially grown layer 10 with a high impurity concentration of from $10^{17}$ to $10^{21}$ atoms per cubic centimeter (see FIG. 6G). The grown layers 20b is identical in conductivity to the grown layer 22 and preferably equal in impurity concentration to the latter. The layer 10 is equal in conductivity to and higher in impurity concentration than the grown layer 22 and eventually forms an anode electrode.

Figure 6E:
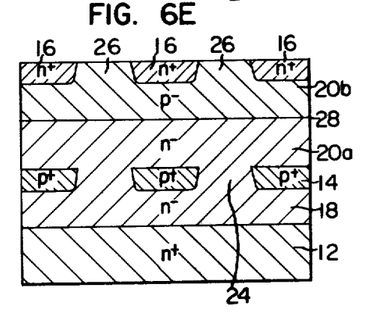
Figure 6F:
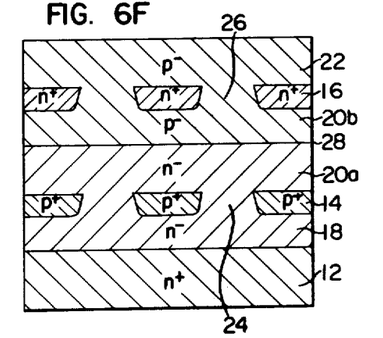
Figure 6G:
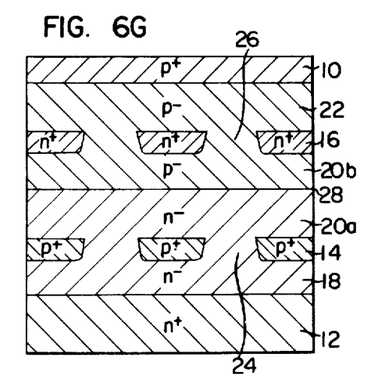
Figure 6H:
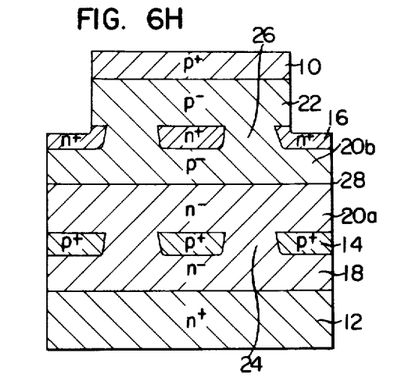
Figure 6I:
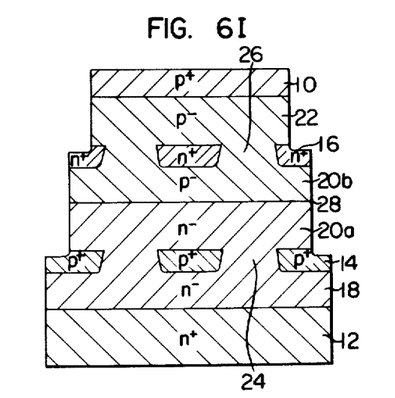

In order to attach gate electrodes to the first and second gate regions 14 and 16 respectively, the peripheral portions of the layers 10 and 22 are etched away into an annular step to expose the peripheral surface portion of the second gate region 16 to be substantially parallel to the surface of the layer 10 as shown in FIG. 6H. Then the peripheral portions of the second gate region 16 and the layers 20b and 20a along with the pn junction 18 are similarly etched away to expose the peripheral surface portion of the first gate region 14 to be substantially parallel to the surface of the layer 10 as shown in FIG. 6I. Following this a pair of gate electrodes 14' and 16' in the form of metallic annuli are disposed in ohmic contact with the exposed surface portions of the second and gate regions 14 and 16 respectively as shown at dotted line in FIG. 6J.

Figure 6J:
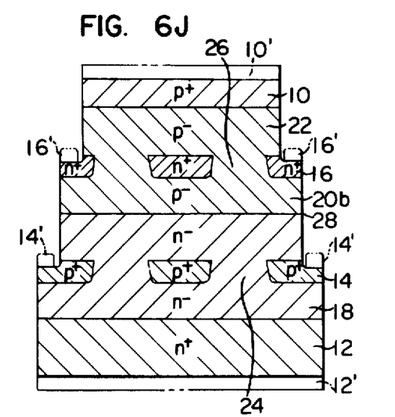

Thus the gate electrodes 14' and 16' look toward a common end of the arrangement.

While the gate metallic electrodes 14' and 16' are directly connected to the gate regions 14 and 16 respectively, they may be electrically connected to the gate regions through the outermost, highly doped semiconductor layers 10 and 12, respectively.

Also an anode and a cathode electrodes 10' and 12' are disposed on ohmic contact with the $p^+$ and $n^+$ type layers 10 and 12 respectively as shown at dotted line in FIG. 6J. By using the steps illustrated in FIGS. 6A through 6J, the substrate has the thickness required for its handling while the $n^-$ type layer can be thin to decrease the forward resistance in its "ON" or conductive state.

FIGS. 7A through 7H show a modification of the process as above described in conjunction with FIGS. 6A through 6J. The process illustrated is different from that shown in FIG. 6 only in that in FIG. 7 a starting material is a p type semiconductor substrate having a low impurity concentration and therefore a resistivity of 1,000 ohm-centimeter or more and serving as the $p^-$ type semiconductor layer 20b with a low impurity concentration and that the sequence of the manufacturing steps is different between both processes.

Figure 7A:
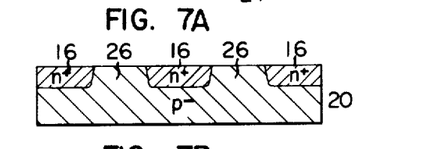
FIGS. 7A through 7H are views similar to FIG. 4 but illustrating a modification of the process shown in FIG. 6.

In FIG. 7A, the step shown in FIG. 6E is repeated to form a second $n^+$ type gate region 16 with a high impurity concentration of from $10^{17}$ to $10^{21}$ atoms per cubic centimeter and a plurality of current path portions 26 on one of the main opposite faces of the $p^-$ type substrate 20b.

Figure 7B:
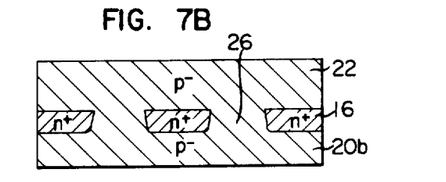

Then the step of FIG. 6F is repeated to epitaxially grow a p⁻ type semiconductor layer 22 with a low impurity concentration of from $10^{11}$ to $10^{16}$ atoms per cubic centimeter on one surface of the n⁻ type layer 20b l as shown in FIG. 7B.

Figure 7C:
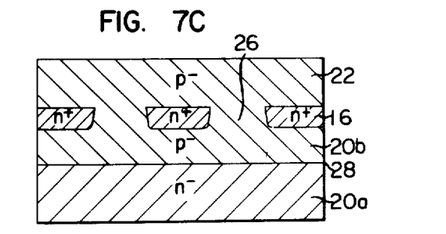

Subsequently an n⁻ type semiconductor layer 20a with a low impurity concentration of from $10^{11}$ to $10^{16}$ atoms per cubic centimeter is epitaxially grown on the other main face of the substrate 20b to form a pn junction 28 therebetween. The resulting structure is shown in FIG. 7C.

Figure 7D:
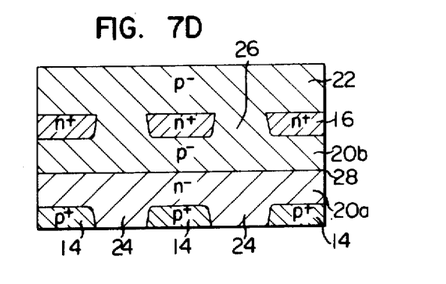

Following this the step as above described in conjunction with FIG. 6B is repeated to selectively form a first apertured gate region 14 with a high impurity concentration of from $10^{17}$ to $10^{21}$ p type atoms per cubic centimeter on the surface of the n⁻ type grown layer 20a while leaving a plurality of semiconductor portions 24 of n⁻ type, the latter forming of the one part of the principal current path (see FIG. 7D).

Figure 7E:
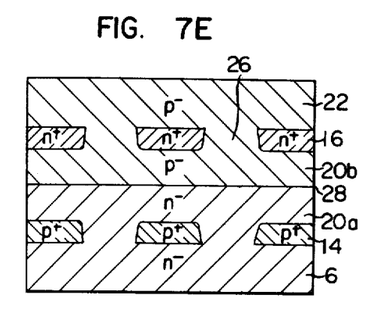

Also the step of FIG. 6C is repeated to epitaxially grow an n⁻ type semiconductor layer 22 with a low impurity concentration of from $10^{11}$ to $10^{16}$ atoms per cubic centimeter on the surface of the n⁻ type layer 20a including the first gate region 14 as shown in FIG. 7E.

Then a p⁺ type semiconductor layer 10 with a high impurity concentration of from $10^{17}$ to $10^{21}$ atoms per cubic centimeter is disposed on the p⁻ type layer 22 while an n⁺ type semiconductor layer 12 with a high impurity concentration of from $10^{17}$ to $10^{21}$ atoms per cubic centimeter is disposed on the p⁻ type layer 18 as in the arrangement of FIG. 6G. The resulting structure is shown in FIG. 7F.

The grown layer 22 is identical in conductivity to the substrate 20b and preferably equal in impurity concentration to the latter. This is true in the case of the layers 20a and 18. Also the layer 10 is identical in conductivity to and higher in impurity concentration than the layer 20b. This is true in the case of the layers 12 and 18.

Figure 7F:
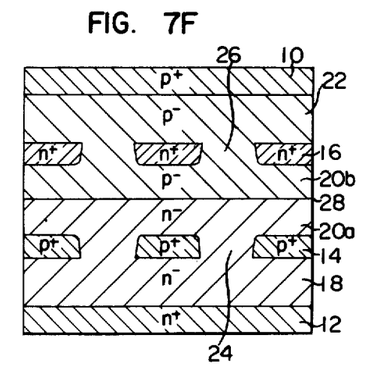
Figure 7G:
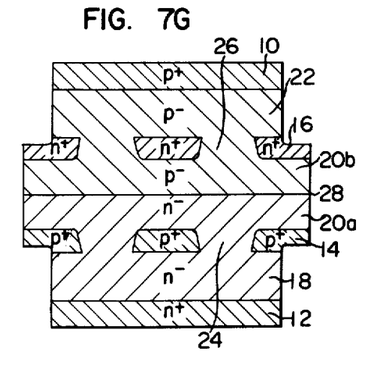

In order to attach gate electrodes to the first and second gate regions 14 and 16 respectively, the step of FIG. 6H is repeated with the upper and lower portions of the arrangement of FIG. 7F to expose the peripheral surface portions of both gate regions 14 and 16. Then gate metallic electrodes 14' and 16' in the form of annuli are disposed in ohmic contact with the exposed portions of the gate layers 14 and 16. Thus the gate electrodes 14' and 16' look toward both ends of the arrangement respectively.

Figure 7H:
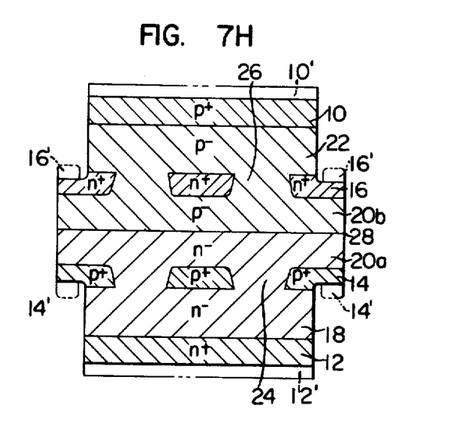

As in the arragnement of FIG. 6J, a metallic anode electrode may be disposed in ohmic contact with the p⁺ type layer 10 while a metallic cathode electrode is similarly disposed on the n⁺ type layer 12 as shown in FIG. 7H.

In the arrangement of FIG. 7H, both gate ellectrodes 14' and 16' may look toward one end of the arrangement as shown in FIG. 6J. Also the arrangement of FIG. 6J may have the gate electrodes looking toward the opposite ends of the arrangement. The use of the steps illustrated in FIGS. 7A through 7H results, of course, in a decrease in the effect of auto-doping while providing an arrangement including an intermediate layer which is thick and low in impurity concentration.

Upon manufacturing the structure including two gate electrodes as above described, an impurity having a smaller diffusion coefficient, for example, n type arsenic may be first diffused into the substrate to form one of both gate regions and then an impurity having a larger diffusion coefficient, for example, p type boron is diffused into the substrate to form the other gate region. This measure permits both gate regions to be readily controlled in dimensions. Also both gate regions may be equal in dimension to each other.

It is to be understood that the figures of the resistivity, impurity concentration and thickness have been mentioned only by way of example and the present invention be not restricted to those figures. That is, the resistivity impurity concentration and thickness may be suitably selected for the particular application. It is also to be understood that the present invention is equally applicable to a variety of semiconductive material involving, in addition to silicon as above described, germanium, semiconductive compounds such as gallium arsenide (AsAs), indium phosphide (InP), gallium-aluminum arsenide (GaAlAs) etc. In addition, it is to be understood that the present invention is not restricted to the epitaxial growth and that it may be practiced with the hertojunction formed between dissimilar semiconductive materials.

While the present invention has been illustrated and described in conjunction with manufacturing of the thyristor as shown in FIG. 2 it is to be understood that the same is equally applicable to the manufacturing of the thyristors shown in the Figures other than FIG. 2.

From the foregoing it is seen that the present invention has provided an electrostatic induction type thyristor comprising a pair of anode and cathode electrodes forming the main electrodes, a highly doped semiconductor region provided on at least one of the anode and cathode electrode, and at least one control electrode located between the anode and cathode electrode so as to have such a configuration that the control electrode or electrodes does or do not block the entire cross section of a principal current path extending between the anode and cathode electrodes. Thus the present thyristor is quite different in the principles of operation from conventional thyristors. More specifically, the control electrode or gate region forms a depletion layer traversing the principal current path to develope a potential barrier thereby to put the thyristor in its forward blocking state. The injection of carriers upon lowering that potential partition causes an abrupt decrease in electric field involved resulting in the turn-on of the thyristor. Also the thyristor is turned off by suspending the injection of the carriers due to a rise in potential barrier caused from the pinch-off effected by the gate region and by drawing out the surplus carriers due to their attraction by the electric field. Therefore the present thyristor has a switching time reduced to one tenth the switching time of conventional thyristors or less and accordingly can be operated at very high speeds without an increase in switching time with which an increase in operating area of the thyristor is attended. As a result, the present invention has a great characteristic feature that it can handle high powers with a high efficiency. In addition, it has the function of interrupting direct currents which has been scarcely attained by the prior art practice.

By using the electrostatic induction type thyristor of the present invention it is possible to control electric motors at high speeds with the high accuracy while still precisely and rapidly effecting the automatic control in the fields of the control not at all considered hereinbefore, for example, the automatic control of tool machines, the follow-up control by radars, the directional control of rockets etc. Also in view of the possibility of interrupting direct currents, inverters employing the present thyristor can be operated at high speeds with high efficienceis as compared with the prior art practice while being used in simplified manner. Further, thyristor-chopper devices employing the present invention become possible to be more preceisely controlled, and simplified in construction while handling high powers. In this way the present invention has very many advantages and the very high industrial merit.

While the invention has been illustrated and described in conjunction with a few preferred embodiments thereof it is to be understood that numerous changes and modifications may be resorted to without departing from the spirit and scope of the present invention. For example, the process of the present invention may proceed with a semiconductor substrate eventually forming any desired semiconductor layer other than the $n^-$ type semiconductor layer 18 (see FIG. 4), the $n^+$ type highly doped layer 12 or the cathode electrode (FIG. 6) or the $p^-$ type semiconductor layer 20b forming one half the intermediate layer of the resulting structure (FIG. 7).

What we claim is:

1. A process of manufacturing a static induction type thyristor comprising a first semiconductor layer of a first type conductivity having a low impurity concentration, a second semiconductor layer of a second type conductivity having a high impurity concentration and disposed in a predetermined pattern on said first semiconductor layer with portions of said first semiconductor layer exposed through said second semiconductor layer and forming PN junctions therebetween, a third semiconductor layer of the first type conductivity having a low impurity concentration disposed on said second semiconductor layer to form PN junctions therebetween, said third semiconductor layer including portions having surfaces contacting exposed portions of said first semiconductor layer, and a fourth semiconductor layer of the second type conductivity disposed on a selected one of said first and third semiconductor layers to form a PN junction therebetween, said process comprising the steps of: providing a semiconductor substrate of the first conductivity type having a low impurity concentration that ranges from $10^{11}$ to $10^{16}$ atoms per cubic centimeter and having a pair of opposite major surfaces with a thickness dimension of said semiconductor substrate defined between said pair of major surfaces, wherein said semiconductor substrate defines said first semiconductor layer; selectively diffusing semiconductor material of the second type conductivity into a first major surface of said substrate to form said second semiconductor layer in said first semiconductor layer so that said second semiconductor layer has a surface impurity concentration of from $10^{17}$ to $10^{21}$ atoms per cubic centimeter, and said second semiconductor layer having an impurity concentration relative to that of said semiconductor substrate for forming therebetween charge depletion regions where no electrical signal is applied to said second semiconductor layer and which prevent injection of charge carriers through said second semiconductor layer when the thyristor is in a blocking state, and said first and second semiconductor layers having relative impurity concentrations such that electrically forward biasing said second semiconductor layer effectuates a sufficient reduction of said depletion regions that a sufficient quantity of charge carriers may be injected through said second semiconductor layer that the thyristor switches from the blocking state to a conductive state; decreasing the thickness of said semiconductor substrate after forming said second semiconductor layer; epitaxially growing semiconductor material to form said third semiconductor layer having the low impurity concentration that ranges from $10^{11}$ to $10^{16}$ atoms per cubic centimeter so as to overlie substantially said second semiconductor layer and portions of said first semiconductor layer exposed to the surface of said second semiconductor layer; and epitaxially growing semiconductor material to form said fourth semiconductor layer on a selected one of said second major surface of said semiconductor substrate and said third semiconductor layer and forming a PN junction therebetween.

2. A process of manufacturing a static induction type thyristor as claimed in claim 1 wherein said third semiconductor layer is formed thicker than said first semiconductor layer through the epitaxial growth followed by the formation of said fourth semiconductor layer.

3. A process of manufacturing a static induction type thyristor as claimed in claim 2 wherein said fourth semiconductor layer has an impurity concentration of from $10^{11}$ to $10^{16}$ atoms per cubic centimeter.

* * * * *